US009916941B2

(12) United States Patent
Devine et al.

(10) Patent No.: US 9,916,941 B2
(45) Date of Patent: Mar. 13, 2018

(54) ELECTRICAL SWITCHING APPARATUS, AND INTERFACE ASSEMBLY AND DISPLAY APPARATUS THEREFOR

(71) Applicant: Eaton Corporation, Cleveland, OH (US)

(72) Inventors: Jack Devine, Pittsburgh, PA (US); Mark A Janusek, Bethel Park, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 15/459,673

(22) Filed: Mar. 15, 2017

(65) Prior Publication Data

US 2017/0186566 A1 Jun. 29, 2017

Related U.S. Application Data

(62) Division of application No. 14/627,250, filed on Feb. 20, 2015, now Pat. No. 9,673,013.

(51) Int. Cl.

| | |
|---|---|
| ***H01H 1/64*** | (2006.01) |
| ***H01H 9/54*** | (2006.01) |
| ***H05K 5/00*** | (2006.01) |
| ***H01H 19/14*** | (2006.01) |
| ***H01H 19/04*** | (2006.01) |

(52) U.S. Cl.
CPC .............. *H01H 9/54* (2013.01); *H01H 19/04* (2013.01); *H01H 19/14* (2013.01); *H05K 5/0017* (2013.01)

(58) Field of Classification Search
CPC ........... H01H 9/54; H01H 19/04; H01H 19/14
USPC .......................................................... 200/293
See application file for complete search history.

(56) References Cited

U.S. PATENT DOCUMENTS

| | | | |
|---|---|---|---|
| 5,362,933 | A | 11/1994 | Kutsche et al. |
| 5,902,973 | A | 5/1999 | Ramey et al. |
| 6,121,889 | A | 9/2000 | Janda et al. |
| 6,194,983 | B1 | 2/2001 | Bogdon et al. |
| 6,680,445 | B1 | 1/2004 | Oravetz et al. |
| 7,186,933 | B2 | 3/2007 | Turner |
| 7,893,370 | B2 | 2/2011 | Schmitt et al. |
| 8,378,245 | B2 | 2/2013 | Fischer |

(Continued)

FOREIGN PATENT DOCUMENTS

| | | | |
|---|---|---|---|
| DE | 92 93 532.9 | U1 | 7/1993 |
| EP | 0 226 530 | A2 | 6/1987 |
| WO | 98/01882 | A1 | 1/1998 |

OTHER PUBLICATIONS

European Patent Office, "International Search Report and Written Opinion" (for corresponding application PCT/US2016/013144), dated Mar. 29, 2016, 15 pp.

*Primary Examiner* — Kyung Lee
(74) *Attorney, Agent, or Firm* — Eckert Seamans; John Powers; Grant Coffield

(57) ABSTRACT

An electrical switching apparatus includes a body and a display apparatus. The body has a housing, a handle partially extending through the housing, separable contacts located within the housing, an operating mechanism structured to open and close the separable contacts, a main printed circuit board located within the housing, and a number of electrical rating settings associated with the main printed circuit board. Each of the number of electrical rating settings has a magnitude. The display apparatus is electrically connected to the main printed circuit board and is structured to display the magnitude of at least one of the number of electrical rating settings.

7 Claims, 10 Drawing Sheets

(56) References Cited

U.S. PATENT DOCUMENTS

| | | | |
|---|---|---|---|
| 2009/0326900 | A1 | 12/2009 | Carlino et al. |
| 2012/0274656 | A1 | 11/2012 | Kang et al. |

ELECTRICAL SWITCHING APPARATUS, AND INTERFACE ASSEMBLY AND DISPLAY APPARATUS THEREFOR

CROSS-REFERENCE TO RELATED APPLICATION

This application is a division of application Ser. No. 14/627,250, filed Feb. 20, 2015, and entitled "ELECTRICAL SWITCHING APPARATUS, AND INTERFACE ASSEMBLY AND DISPLAY APPARATUS THEREFOR" the contents of which are incorporated herein by reference.

BACKGROUND

Field

The disclosed concept pertains generally to electrical switching apparatus, such as, for example, circuit breakers. The disclosed concept also pertains to interface assemblies and display apparatus for electrical switching apparatus.

Background Information

Electrical switching apparatus, are used to protect electrical circuitry from damage due to a trip condition, such as, for example, an overcurrent condition, an overload condition, an undervoltage condition, a relatively high level short circuit or fault condition, a ground fault or arc fault condition. Electronic molded case circuit breakers, for example, include at least one pair of separable contacts which are operated either manually by way of a handle disposed on the outside of the case, or automatically by way of a trip unit in response to the trip condition.

As technology has evolved, additional electronic features have been added to molded case circuit breakers. Many of these electronic features are controlled by adjustment knobs on an outer surface of the circuit breaker. However, when an interface assembly, including for example, a rotary handle, is connected with the main housing of the circuit breaker, many of these knobs are often unable to be viewed and/or adjusted. As a result, service times are undesirably increased because the interface assembly must be disconnected to access the adjustment knobs.

There is, therefore, room for improvement in electrical switching apparatus and in interface assemblies and display apparatus therefor.

SUMMARY

These needs and others are met by embodiments of the disclosed concept, which are directed to an electrical switching apparatus including a display apparatus, wherein the magnitude of a number of electrical rating settings is able to be determined.

In accordance with one aspect of the disclosed concept, an electrical switching apparatus includes a body and a display apparatus. The body has a housing, a handle partially extending through the housing, separable contacts located within the housing, an operating mechanism structured to open and close the separable contacts, a main printed circuit board located within the housing, and a number of electrical rating settings associated with the main printed circuit board. Each of the number of electrical rating settings has a magnitude. The display apparatus is electrically connected to the main printed circuit board and is structured to display the magnitude of at least one of the number of electrical rating settings.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "coupling member" refers to any suitable connecting or tightening mechanism expressly including, but not limited to, zip ties, wire ties, rivets, screws, bolts and the combinations of bolts and nuts (e.g., without limitation, lock nuts) and bolts, washers and nuts.

As employed herein, the statement that two or more parts are "connected" or "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or components.

Figure 1:
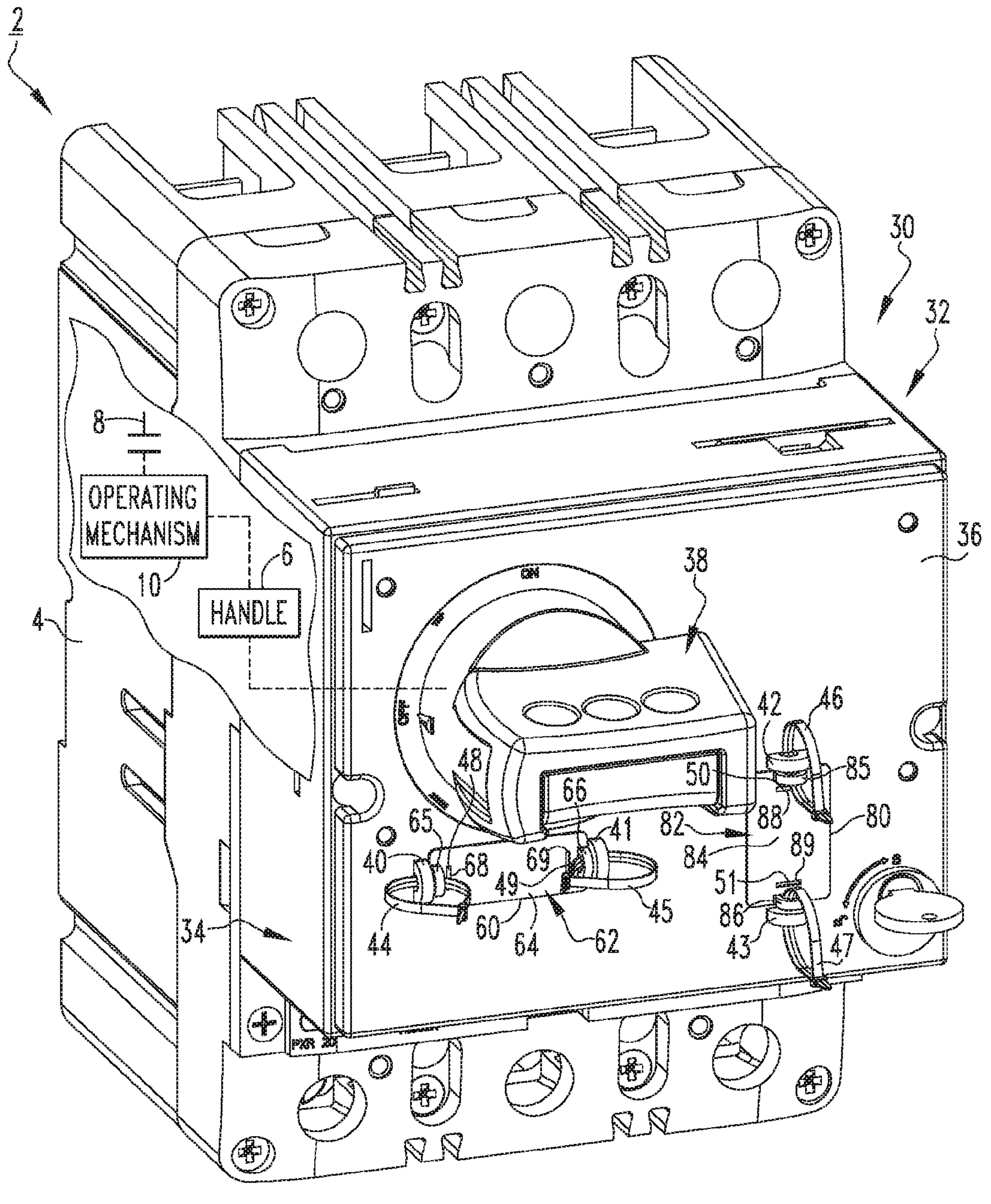
FIG. 1 is an isometric view of an electrical switching apparatus and interface assembly therefor, in accordance with a non-limiting embodiment of the disclosed concept.

FIG. 1 shows an electrical switching apparatus (e.g., molded case circuit breaker 2) in accordance with a non-limiting embodiment of the disclosed concept. The example circuit breaker 2 includes a housing 4, an operating handle 6 (shown in simplified form), separable contacts 8 (shown in simplified form) located within the housing, and an operating mechanism 10 (shown in simplified form) for opening and closing the separable contacts 8. The operating handle 6 partially extends through the housing 4.

Figure 2:
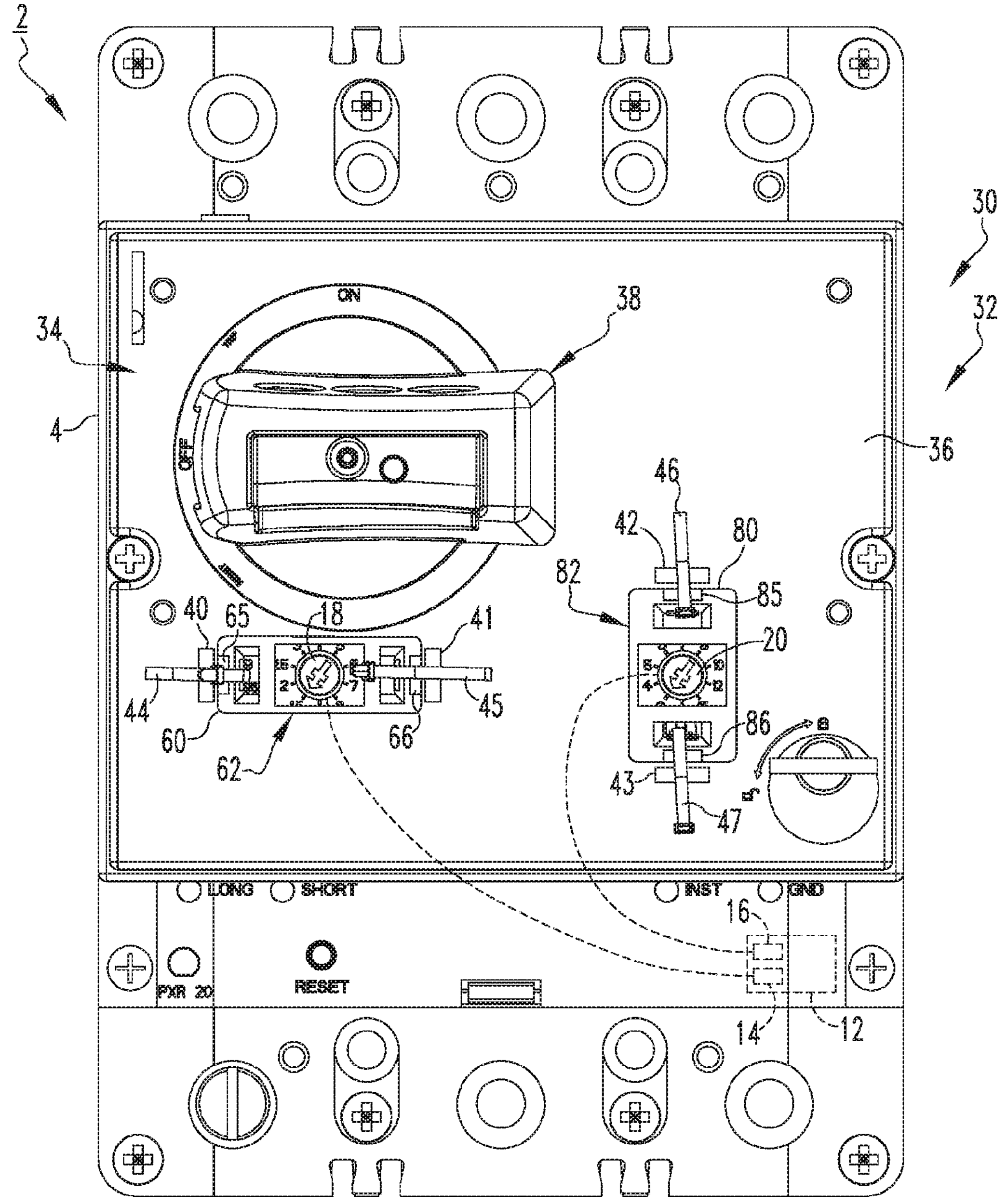
FIG. 2 is a top plan view of the electrical switching apparatus and interface assembly therefor of FIG. 1.
Figure 3:
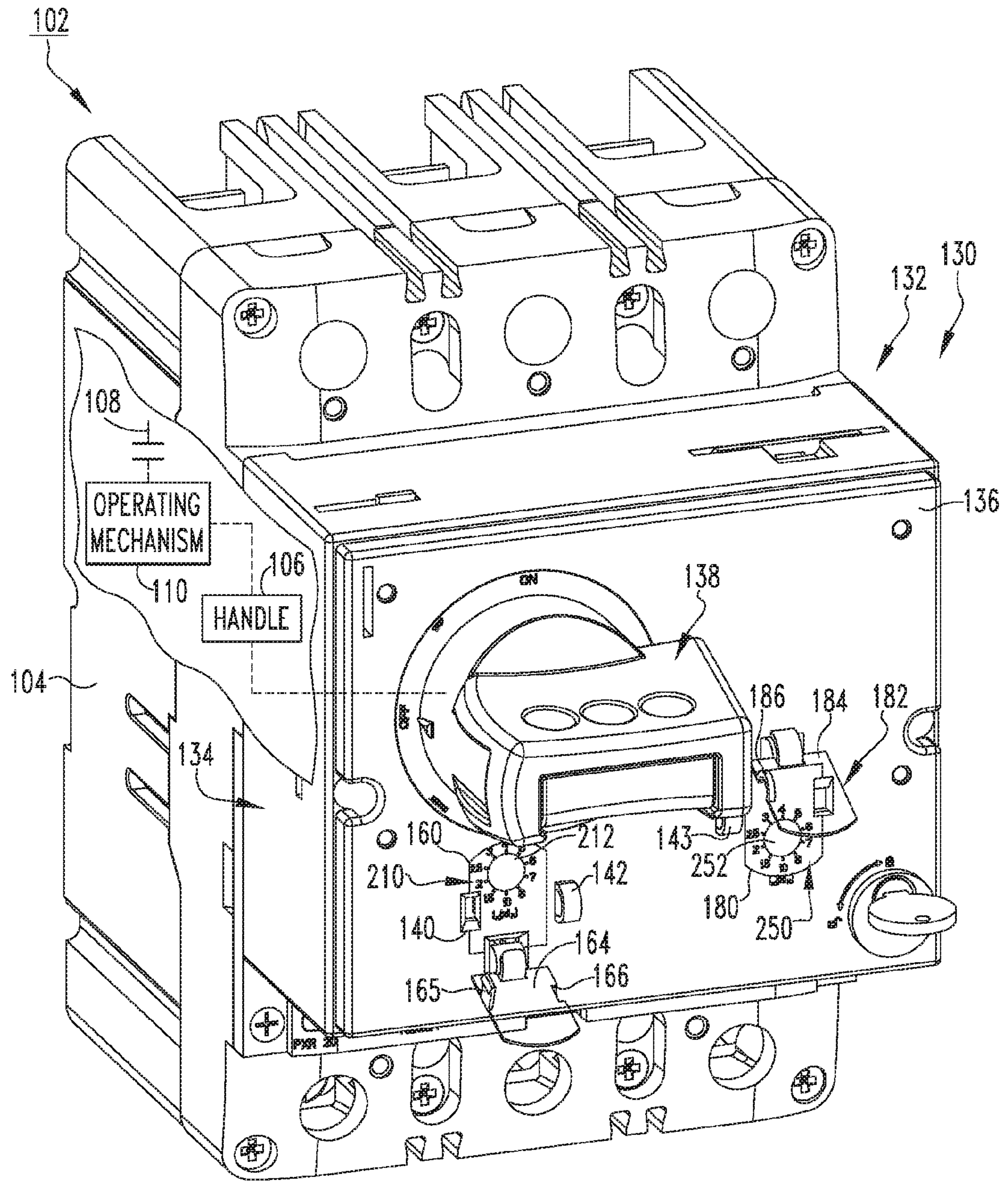
FIG. 3 is an isometric view of an electrical switching apparatus and interface assembly therefor, shown without the coupling members and with the windows open, in accordance with another non-limiting embodiment of the disclosed concept.

Referring to FIG. 2, the circuit breaker 2 further has a main printed circuit board 12 (shown in simplified form in hidden line drawing) located within the housing 4. The circuit breaker 2 also includes a number of electrical rating settings (e.g., without limitation, current rating setting 14 and ground fault setting 16, each shown in simplified form) associated with the main printed circuit board 12. The current rating setting 14 and the ground fault setting 16 each have a magnitude that is predetermined by an operator. Continuing to refer to FIG. 2, the circuit breaker 2 further has a number of knobs (see, for example, current rating knob 18 and an example ground fault knob 20, shown in FIG. 2). The current rating knob 18 shows the magnitude and adjusts the magnitude of the current rating setting 14. The ground fault knob 20 shows the magnitude and adjusts the magnitude of the ground fault setting 16. It will be appreciated that the current rating knob 18 and the ground fault knob 20 are each generally located internal the housing 4. However, in accordance with the disclosed concept, the current rating knob 18 and the ground fault knob 20 are each visible from an observation point external the circuit breaker 2. As will be discussed in greater detail below, the circuit breaker 2 further includes an improved interface assembly 30 located on the housing 4 which advantageously overcomes disadvantages associated with the prior art by allowing the magnitudes of the current rating setting 14 and the ground fault setting 16, for example, to be visible.

The interface assembly 30 includes a base assembly 32 and a rotary handle 38 coupled to the base assembly 32. The base assembly 32 has a base 34 that is located on the housing 4. The base 34 has a mounting surface 36 and the rotary handle 38 is coupled to the mounting surface 36. The rotary handle 38 and the operating handle 6 are structured to drive each other. More specifically, when the rotary handle 38 is rotated, such as for example, by an operator, the operating handle 6 is caused to rotate. Similarly, when the operating handle 6 rotates, such as for example, in response to the circuit breaker 2 tripping open, the rotary handle 38 is caused to correspondingly rotate.

The mounting surface 36 has a number of ports (two ports 60,80 are shown in the example of FIG. 1 and FIG. 2) that allow the respective knobs 18,20 to be visible from the exterior of the circuit breaker 2 and the interface assembly 30. The ports 60,80 are openings in the mounting surface 36 that are aligned with each of the respective knobs 18,20. More specifically, when viewed from a top plan view (FIG. 2), the current rating knob 18 is centrally located in the port 60 and the ground fault knob 20 is centrally located in the port 80. In this manner, and with reference to FIG. 2, when an operator looks through the port 60, because the current rating knob 18 is visible, the magnitude of the current rating setting 14 is visible through the port 60. Similarly, when an operator looks through the port 80, because the ground fault knob 20 is visible, the magnitude of the ground fault setting 16 is visible through the port 80. Accordingly, service times associated with the circuit breaker 2 are advantageously decreased. More specifically, if an operator needs to know the magnitude of the current rating setting 14 and/or the magnitude of the ground fault setting 16, the operator does not need to disconnect and remove the interface assembly 30 from the housing 4 in order to view the respective current rating knob 18 and the respective ground fault knob 20. Rather, the operator can simply look through the respective ports 60,80 to view the respective knobs 18,20, which display the magnitudes of the current rating setting 14 and the ground fault setting 16, respectively.

Additionally, in order to prevent tampering with the current rating knob 18 and the ground fault knob 20, the base assembly 32 preferably further includes a number of windows (two example windows 62,82 are shown in FIG. 1 and FIG. 2) and a number of coupling members (four example coupling members 44,45,46,47 are shown in FIG. 1 and FIG. 2) for coupling the respective windows 62,82 to the mounting surface 36. As shown, each of the windows 62,82 includes a respective viewing portion 64,84, a number of respective protrusions (two example semi annular-shaped protrusions 65,66 are shown on the window 62, and two example semi annular-shaped protrusions 85,86 are shown on the window 82) extending away from the respective viewing portion 64,84. The base 34 has a number of projections (four example projections 40,41,42,43 are shown) extending away from the mounting surface 36. The projections 40,41,42,43 and the mounting surface 36 are preferably made of a single piece of material (e.g., an injection molded piece), advantageously simplifying manufacturing of the base 34 and thereby reducing cost. Similarly, the respective viewing portions 64,84 and the respective protrusions 65,66,85,86 are preferably made of a single piece of material (e.g., an injection molded piece), advantageously simplifying manufacturing of the respective windows 62,82.

As shown, each of the respective viewing portions 64,84 is located between a corresponding pair of the protrusions 65,66,85,86. Additionally, each of the respective windows 62,82 is located between a respective pair of the projections 40,41,42,43, advantageously allowing the respective windows to be aligned with the respective ports 60,80. As shown in FIG. 1, each of the respective coupling members 44,45,46,47 extends through a respective one of the projections 40,41,42,43 and a respective one of the protrusions 65,66,85,86 in order to couple the respective window 62,82 to the mounting surface 36.

Furthermore, and with reference to FIG. 1, each of the windows 62,82 has a number of apertures (two example apertures 68,69 are shown in the window 62, and two example apertures 88,89 are shown in the window 82). The base 34 has a number of securing extensions (four example securing extensions 48,49,50,51 are shown) that extend away from the mounting surface 36. Each of the securing extensions 48,49,50,51 extends into a corresponding one of the apertures 68,69,88,89 in order to secure each of the respective windows 62,82 to the mounting surface 36 by a snap-fit mechanism. In addition to providing a relatively secure mechanism to connect the windows 62,82 to the mounting surface, the securing extensions 48,49,50,51 and the apertures 68,69,88,89 advantageously provide a reliable mechanism to align the respective windows 62,82 over the respective ports 60,80.

More specifically, each of the windows 62,82 substantially overlays a respective one of the ports 60,80. In other words, the perimeter of each of the respective windows 62,82 is generally on top of the perimeter of the respective ports 60,80. Additionally, each of the windows 62,82 is transparent. In this manner, the current rating knob 18 and the ground fault knob 20 are each visible through the respective windows 62,82. It follows that the magnitude of the current rating setting 14 is visible through the window 62, and the magnitude of the ground fault setting 16 is visible through the window 82. Furthermore, because the windows are solid, undesirable tampering with the current rating knob 18 and the ground fault knob 20 is advantageously avoided.

Although the circuit breaker 2 has been described in association with the current rating setting 14 and the ground fault setting 16 being visible through the respective ports 60,80 and the respective windows 62,82, it will be appreciated that the disclosed concept is applicable to any suitable alternative electrical rating setting (not shown or indicated) and/or with any suitable alternative electrical switching apparatus (not shown or indicated).

FIG. 3 to FIG. 6 shows another electrical switching apparatus (e.g., molded case circuit breaker 102) in accordance with a non-limiting embodiment of the disclosed concept. The example circuit breaker 102 includes a housing 104, an operating handle 106 (shown in simplified form), separable contacts 108 (shown in simplified form) located within the housing, and an operating mechanism 110 (shown in simplified form) for opening and closing the separable contacts 108. The operating handle 106 partially extends through the housing 104.

Figure 4:
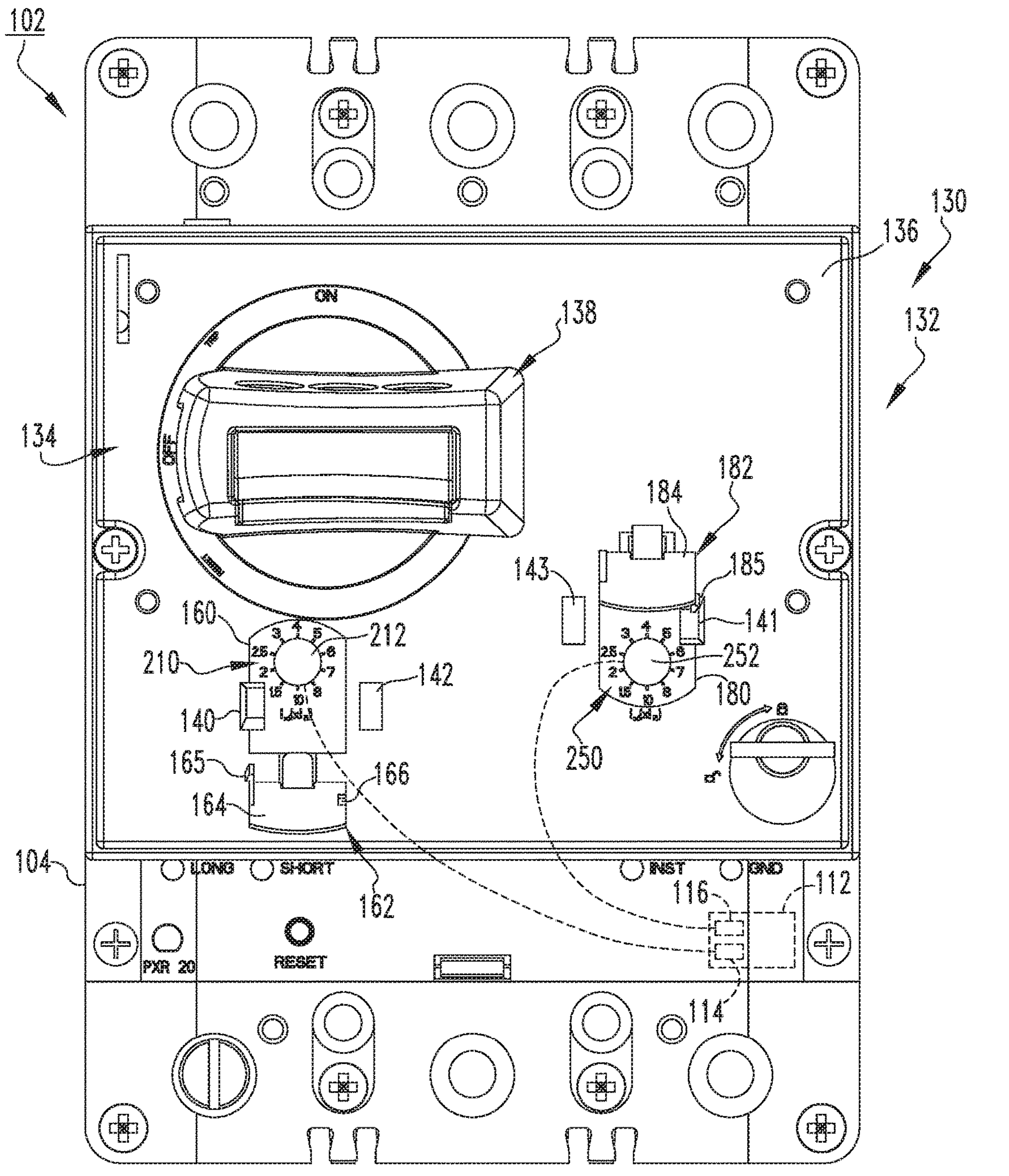
FIG. 4 is a top plan view of the electrical switching apparatus and interface assembly therefor of FIG. 3.

Referring to FIG. 4, the circuit breaker 102 further has a main printed circuit board 112 (shown in simplified form in hidden line drawing) located within the housing 104. The circuit breaker 102 also includes a number of electrical rating settings (e.g., without limitation, current rating setting 114 and ground fault setting 116, each shown in simplified form) associated with the main printed circuit board 112. The current rating setting 114 and the ground fault setting 116 each have a magnitude that is predetermined by an operator. As will be discussed in greater detail hereinbelow, the circuit breaker 102 further includes an interface assembly 130 located on the housing 104 which advantageously allows the magnitudes of the current rating setting 114 and the ground fault setting 116 to be determined and adjusted.

The interface assembly 130 includes a base assembly 132 and a rotary handle 138 coupled to the base assembly 132. The base assembly 132 has a base 134 that is located on the housing 104. The base 134 has a mounting surface 136 and the rotary handle 138 is coupled to the mounting surface 136. The rotary handle 138 and the operating handle 106 are structured to drive each other. In other words, when the rotary handle 138 is rotated, such as for example, by an operator, the operating handle 106 is caused to rotate. Similarly, when the operating handle 106 is rotated, such as for example, by tripping of the circuit breaker 102, the rotary handle 138 is caused to rotate.

Figure 5:
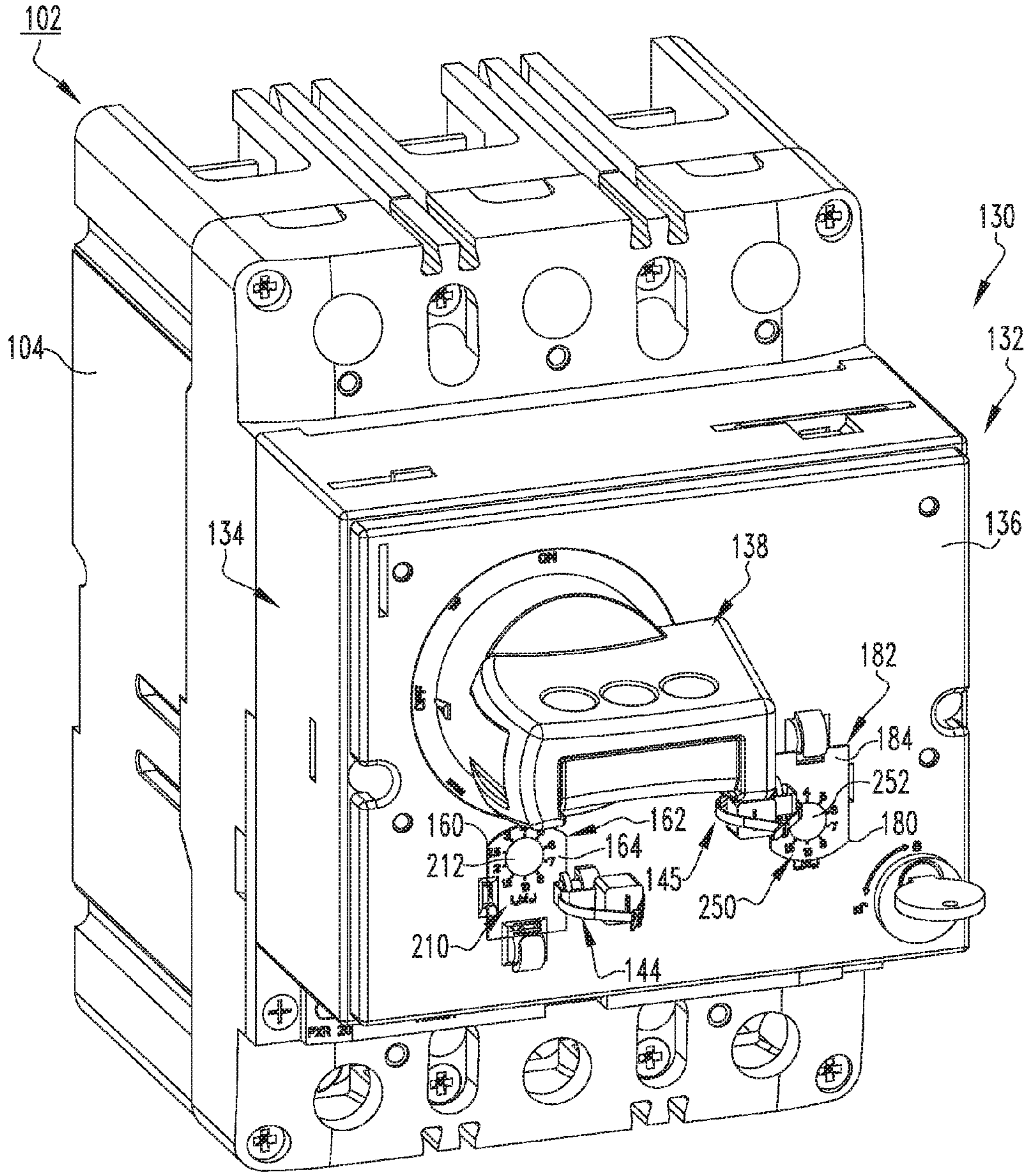
FIG. 5 is another isometric view of the electrical switching apparatus and interface assembly therefor of FIG. 3, shown with the coupling members and with the windows closed.
Figure 6:
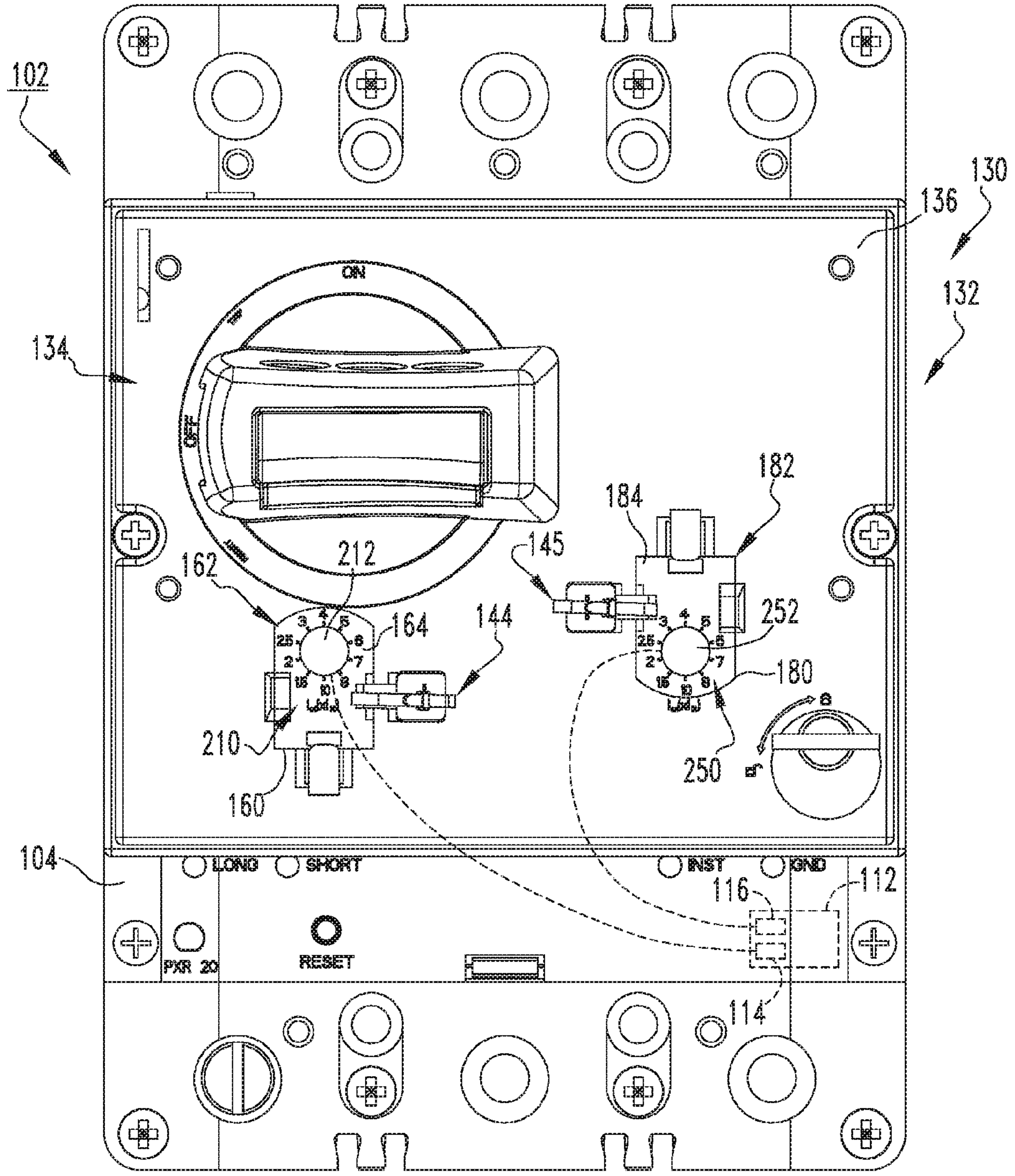
FIG. 6 is a top plan view of the electrical switching apparatus and interface assembly therefor of FIG. 5.

The mounting surface 136 has a number of ports (two ports 160,180 are shown in the example of FIGS. 3-6). As can be seen in FIGS. 3-6, and as will be further appreciated with reference to FIGS. 7-9, the base assembly 132 further includes a number of adjustment assemblies (e.g., an example current rating adjustment assembly 210 and an example ground fault adjustment assembly 250 are shown in FIGS. 3-6). The current rating adjustment assembly 210 includes a current rating adjustment member 212. The current rating adjustment member 212 shows the magnitude and adjusts the magnitude of the current rating setting 114 (FIG. 4 and FIG. 6). Similarly, the ground fault adjustment assembly 250 includes a ground fault adjustment member 252. The ground fault adjustment member 252 shows the magnitude and adjusts the magnitude of the ground fault setting 116 (FIG. 4 and FIG. 6).

As shown, the current rating adjustment member 212 is visible through the port 160. Similarly, the ground fault adjustment member 252 is visible through the port 180. In this manner, when an operator looks through the port 160, because the current rating adjustment member 212 is visible, the magnitude of the current rating setting 114 is visible through the port 160. Similarly, when an operator looks through the port 180, because the ground fault adjustment member 252 is visible, the magnitude of the ground fault setting 116 is visible through the port 180. Accordingly, service times associated with the circuit breaker 102 are advantageously decreased. More specifically, if an operator needs to know the magnitude of the current rating setting 114 and the magnitude of the ground fault setting 116, the operator does not need to disconnect the interface assembly 130 from the housing 104. Rather, the operator can simply look through the respective ports 160,180 to view the respective adjustment members 212,252, which display the magnitudes of the current rating setting 114 and the ground fault setting 116, respectively.

The current rating adjustment member 212 and the ground fault adjustment member 252 also advantageously adjust the magnitudes of the respective electrical rating settings 114, 116. More specifically and with reference to FIG. 7, the circuit breaker 102 (FIGS. 3-6) further includes a number of knobs (an example current rating adjustment knob 118 is shown in simplified form in FIG. 7) that are each structured to adjust a corresponding one of the electrical rating settings 114,116. It will be appreciated that the current rating adjustment knob 118 is generally located internal the housing 104. Additionally, the current rating adjustment knob 118 is connected to the current rating adjustment assembly 210.

Figure 8:
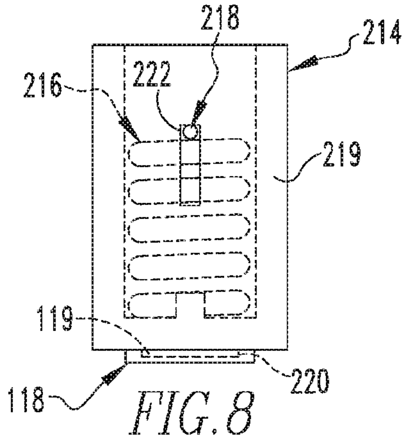
FIG. 8 is a side view of a portion of the adjustment assembly of FIG. 7, shown as employed on an adjustment knob.
Figure 9:
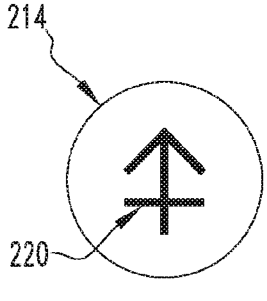
FIG. 9 is a bottom plan view of a coupling member of the adjustment assembly of FIG. 7.

The current rating adjustment assembly 210 includes the current rating adjustment member 212, a coupling member 214, a spring 216, and a retention member 218. Referring to FIGS. 8 and 9, the coupling member 214 includes a body 219 and a protrusion 220 that extends from the body 219. Similarly, the current rating adjustment knob 118 includes a recessed portion 119 that is shaped substantially similarly to the protrusion 220. FIG. 9 shows the shape of the protrusion 220, which can generally be described as including an arrow-shaped body with a linear body intersecting the arrow-shaped body. It will be appreciated that the protrusion 220 extends into and is secured within the recessed portion 119 of the current rating adjustment knob 118. In this manner, and as will be discussed further, when the coupling member 214 rotates, the protrusion 220 causes the current rating adjustment knob 118 to correspondingly rotate together with (i.e., at the same rotational velocity as) the coupling member 214.

Figure 7:
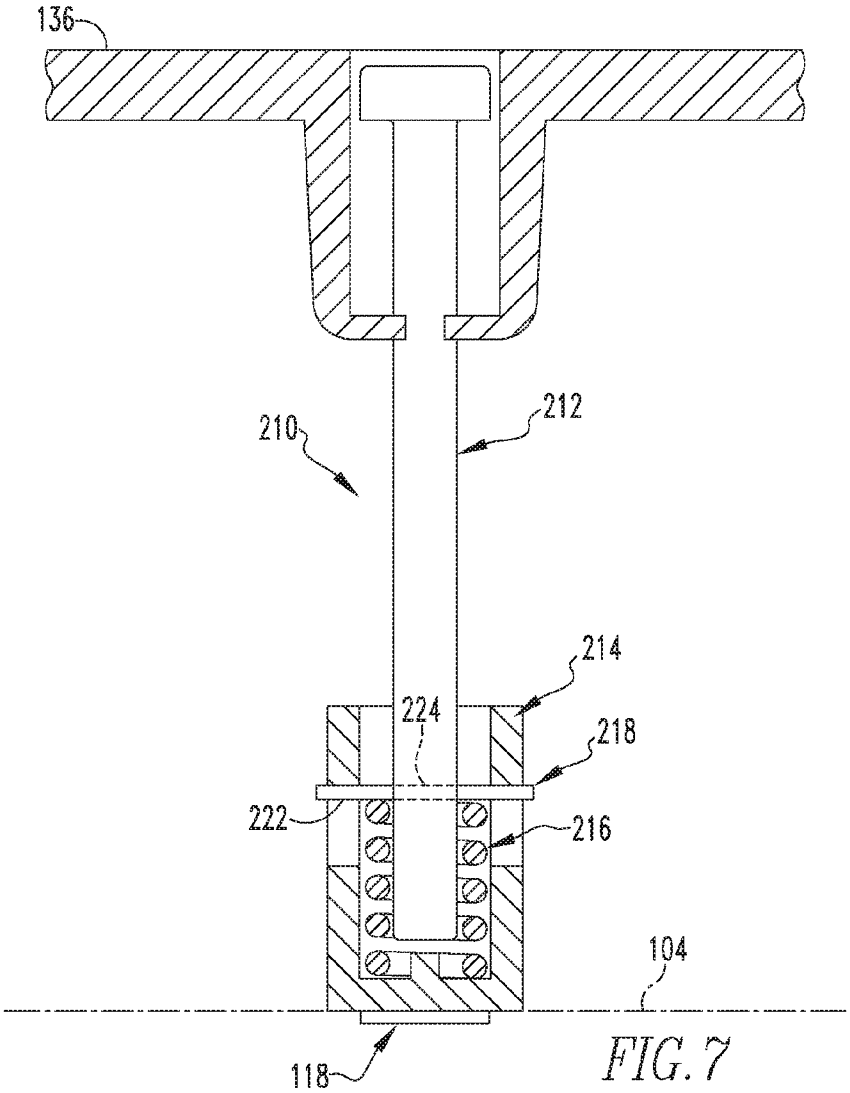
FIG. 7 is a simplified section view of an adjustment assembly and a portion of the electrical switching apparatus and interface assembly therefor of FIG. 3.

Continuing to refer to FIGS. 7 and 8, the body 219 of the coupling member 214 has a slot 222. Similarly, the current rating adjustment member 212 has a thru hole 224. The retention member 218 extends through the thru hole 224 of the current rating adjustment member 212. Additionally, the retention member 218 at least partially extends through the slot 222 of the coupling member 214 in order to retain the spring 216 within the coupling member 214. Additionally, this configuration advantageously allows torque to be transmitted from the current rating adjustment member 212 to the coupling member 214, which in turn drives the current rating adjustment knob 118. Thus, when an operator desires to adjust the current rating setting 114 (FIG. 4 and FIG. 6), the operator simply needs to rotate the current rating adjustment member 212. Because the retention member 218 extends through each of the current rating adjustment member 212 and the coupling member 214, the coupling member 214 will be caused to rotate at the same rotational velocity as the current rating adjustment member 212. Because the current rating adjustment knob 118 (FIG. 7 and FIG. 8) is connected with the coupling member 214, the current rating adjustment knob 118 will likewise be caused to rotate, advantageously adjusting the current rating setting 114 (FIG. 4 and FIG. 6). Thus, the current rating adjustment assembly 210 adjusts the current rating adjustment knob 118, which in turn adjusts the magnitude of the current rating setting 114 (FIG. 4 and FIG. 6).

It will be appreciated that the circuit breaker 102 also includes a ground fault adjustment knob (not shown) that is generally located internal the housing 104 and that is connected to the ground fault adjustment assembly 250. The ground fault adjustment assembly 250 includes similar components (not shown) that are connected in the same manner as the current rating adjustment assembly 210. Additionally, the ground fault adjustment assembly 250 is connected with the ground fault adjustment knob (not shown) in substantially the same manner as the current rating adjustment knob 118 and the current rating adjustment assembly 210. Thus, when an operator desires to adjust the ground fault setting 116 (FIG. 4 and FIG. 6), the operator simply needs to rotate the ground fault adjustment member 252, which will cause the corresponding ground fault adjustment knob (not shown) to rotate, thus adjusting the ground fault setting 116 (FIG. 4 and FIG. 6).

Additionally, in order to prevent tampering with the current rating adjustment member 212 and the ground fault adjustment member 252, the base assembly 132 preferably further includes a number of windows (two example windows 162,182 are shown in FIGS. 3-6 that are pivotably coupled to the mounting surface 136. As shown, each of the windows 162,182 includes a respective viewing portion 164,184, a number of respective securing members (one example securing member 165 (see FIG. 3),185 (see FIG. 4) is shown with each respective window 162,182), and a number of respective protrusions (one example semi annular-shaped protrusion 166,186 is shown with each respective window 162,182). The respective viewing portions 164,184, the respective securing members 165,185, and the respective protrusions 166,186 are preferably made of a single piece of material (e.g., an injection molded piece), advantageously simplifying manufacturing of the respective windows 162, 182. The protrusions 166,186 extend away from the respective viewing portions 164,184. The securing members 165, 185 extend away from the respective viewing portions 164,184. The respective protrusions 166,186 and the respective securing members 165,185 are located on opposing sides of the respective viewing portions 164,184. Additionally, the base 134 has a number of receiving portions (two example receiving portions 140,141 are shown in FIG. 4) that extend from the mounting surface 136 toward the housing 104. In operation, the securing members 165,185 are coupled to the respective receiving portions 140,141 by a snap-fit mechanism, advantageously securing the respective windows 162,182 to the mounting surface 136.

In order to provide an additional mechanism to secure the respective windows 162,182 to the mounting surface and prevent tampering with the respective adjustment members 212,252, the base assembly 132 preferably further includes a number of coupling members (two example coupling members 144,145 are shown in FIG. 5 and FIG. 6) for coupling the respective windows 162,182 to the mounting surface 136. More specifically, the base 134 has a number of projections (two example semi annular-shaped projections 142,143 are shown) extending from the mounting surface 136 away from the housing 104. The respective projections 142,143 and the mounting surface 136 are preferably made of a single piece of material, advantageously simplifying manufacturing of the base 134. As shown in FIG. 5 and FIG. 6, each of the respective coupling members 144,145 extends through a respective one of the projections 142,143 and a respective one of the protrusions 166,186 in order to couple the respective window 162,182 to the mounting surface 136.

Each of the windows 162,182 substantially overlays a respective one of the ports 160,180. In other words, the perimeter of the respective viewing portion 164,184 is generally on top of the perimeter of the respective ports 160,180. Additionally, each of the windows 162,182 is preferably transparent. As shown in FIG. 4 and FIG. 6, the respective adjustment members 212,252 are generally centrally located in the respective ports 162,182, when the circuit breaker 102 is viewed from a top plan view. In this manner, the current rating adjustment member 212 and the ground fault adjustment member 252 are each visible through the respective windows 162,182. It follows that the magnitude of the current rating setting 114 is visible through the window 162 and the magnitude of the ground fault setting 116 is visible through the window 182. Furthermore, because the windows are solid, undesirable tampering with the current rating adjustment member 212 and the ground fault adjustment member 252 is advantageously avoided.

Additionally, referring again to FIG. 7, the current rating adjustment assembly 210 extends from proximate the current rating adjustment knob 118 to proximate the mounting surface 136, advantageously allowing the magnitude of the current rating setting 114 (FIG. 4 and FIG. 6) to be adjusted through the port 160 (FIG. 3-FIG. 6). More specifically, the current rating adjustment member 212 extends from proximate the current rating adjustment knob 118 to proximate the mounting surface 136. In operation, if an operator desires to adjust the magnitude of the current rating setting 114 (FIG. 4 and FIG. 6), the operator simply needs to remove the coupling member 144 and open the pivotably coupled window 162 in order to access and rotate the current rating adjustment member 212, which terminates proximate the mounting surface 136. It will be appreciated that the ground fault adjustment assembly 250 likewise extends from proximate the ground fault adjustment knob (not shown) to the mounting surface 136, and that the ground fault setting 116 (FIG. 4 and FIG. 6) can be adjusted in substantially the same manner as the current rating setting 114 (FIG. 4 and FIG. 6).

Figure 10:
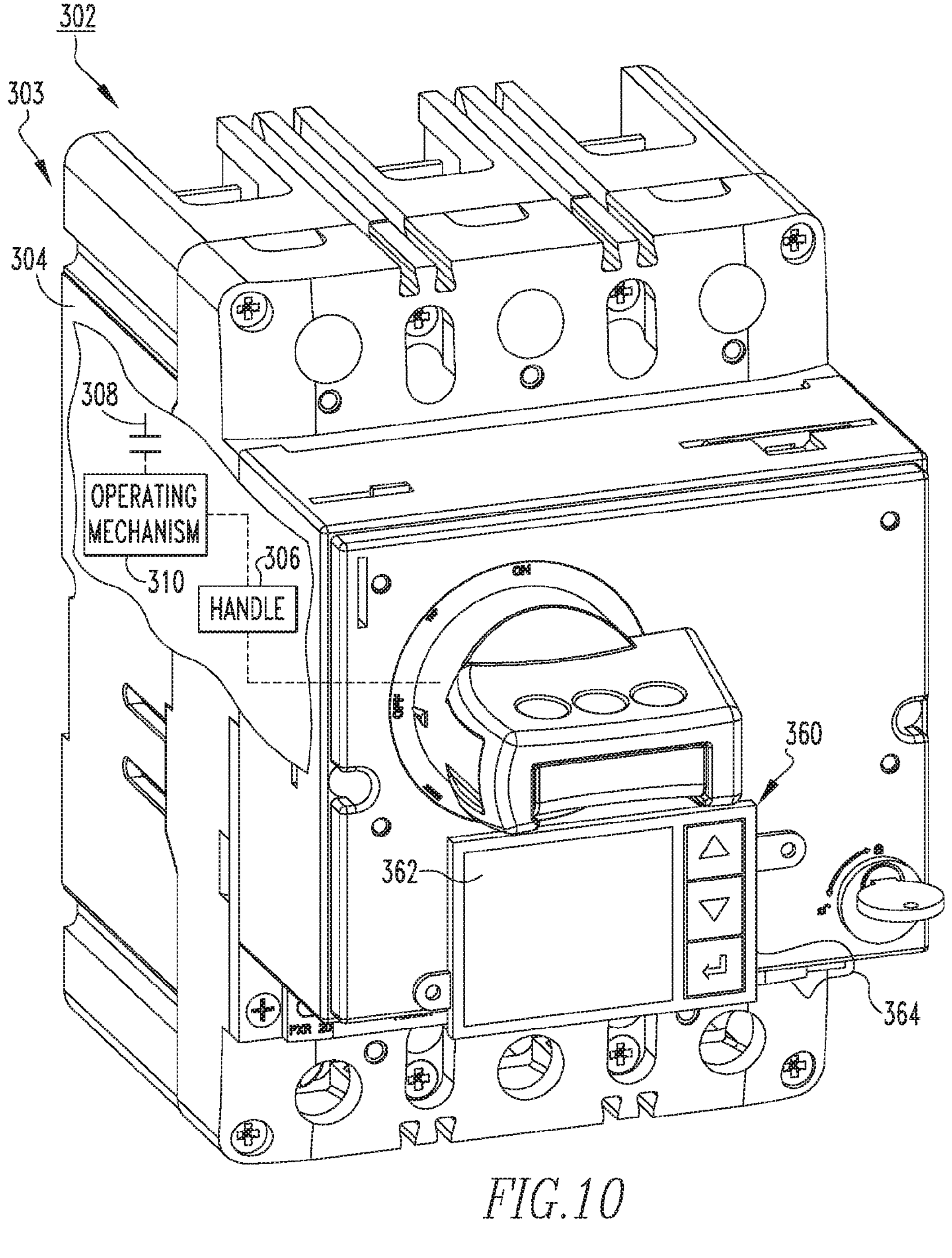
FIG. 10 is an isometric view of an electrical switching apparatus including a display apparatus, in accordance with another non-limiting embodiment of the disclosed concept.
Figure 11:
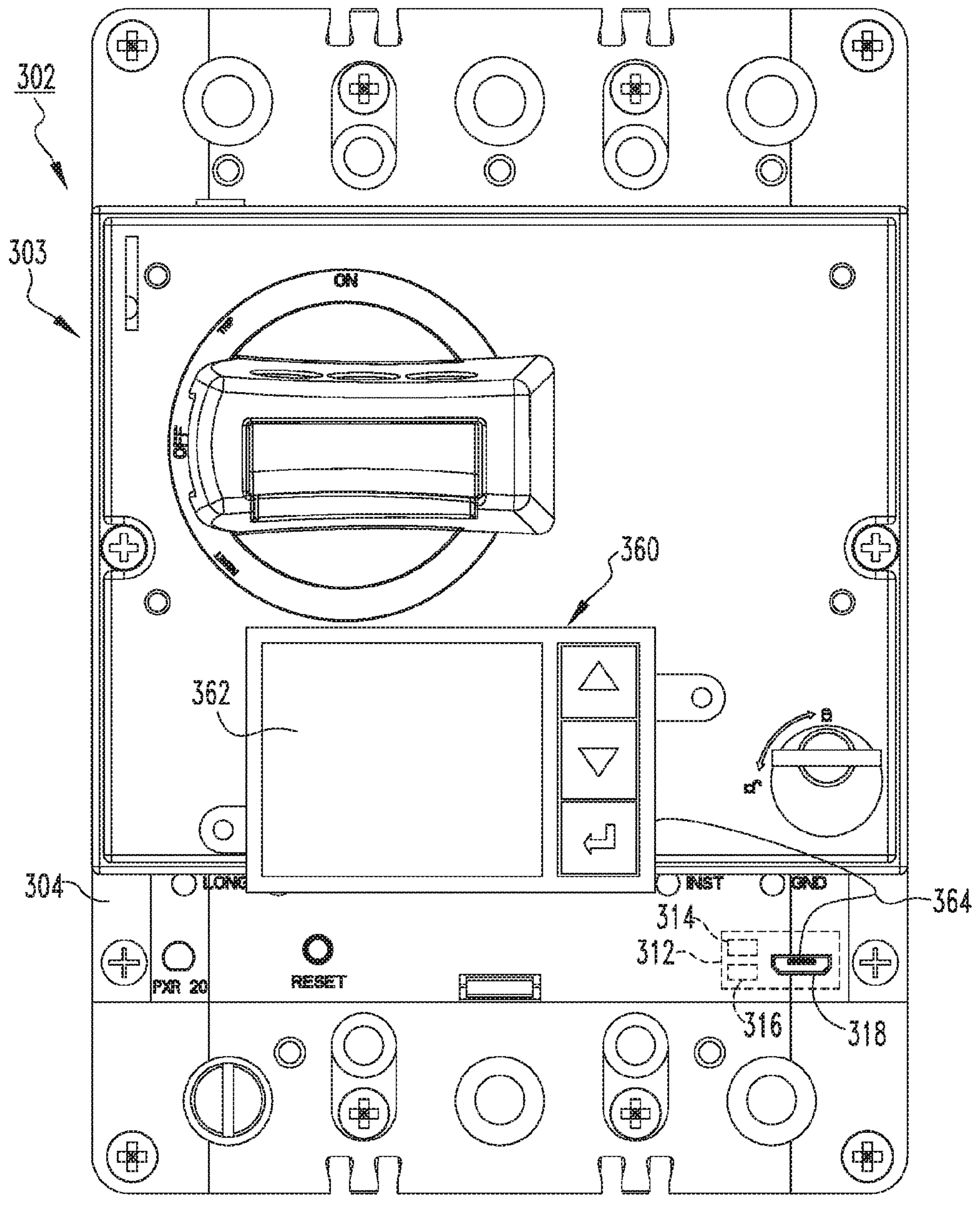
FIG. 11 is a top plan view of the electrical switching apparatus and display apparatus of FIG. 10.

FIG. 10 and FIG. 11 show another electrical switching apparatus (e.g., molded case circuit breaker 302) in accordance with another non-limiting embodiment of the disclosed concept. The example circuit breaker 302 includes a body 303. The body 303 includes a housing 304, an operating handle 306 (shown in simplified form), separable contacts 308 (shown in simplified form) located within the housing, and an operating mechanism 310 (shown in simplified form) for opening and closing the separable contacts 308. The operating handle 306 partially extends through the housing 304.

Referring to FIG. 11, the body 303 further has a main printed circuit board 312 (shown in simplified form in hidden line drawing) located within the housing 304. The body 303 also includes a number of electrical rating settings (e.g., without limitation, current rating setting 314 and ground fault setting 316, each shown in simplified form) associated with the main printed circuit board 312. The current rating setting 314 and the ground fault setting 316 each have a magnitude that is predetermined by an operator. As will be discussed in greater detail hereinbelow, the circuit breaker 302 further includes a display apparatus 360, which in the example of FIG. 10 and FIG. 11 is located on the body 303, which advantageously allows the magnitudes of the current rating setting 314 and the ground fault setting 316 to be easily determined and adjusted.

The display apparatus 360 is electrically connected with the main printed circuit board 312 and advantageously allows an operator to view and adjust the magnitude of the current rating setting and the magnitude of the ground fault setting 316. More specifically, the display apparatus 360 includes a display screen 362 and a cable 364 (shown in simplified form). In the example of FIGS. 10 and 11, the display screen 362 is connected to the body 303. Additionally, the main printed circuit board 312 includes a universal serial bus port 318. The cable 364 is electrically connected to the display screen 362 and extends into the universal serial bus port 318 in order to connect the display screen 362 with the main printed circuit board 312.

Figure 12:
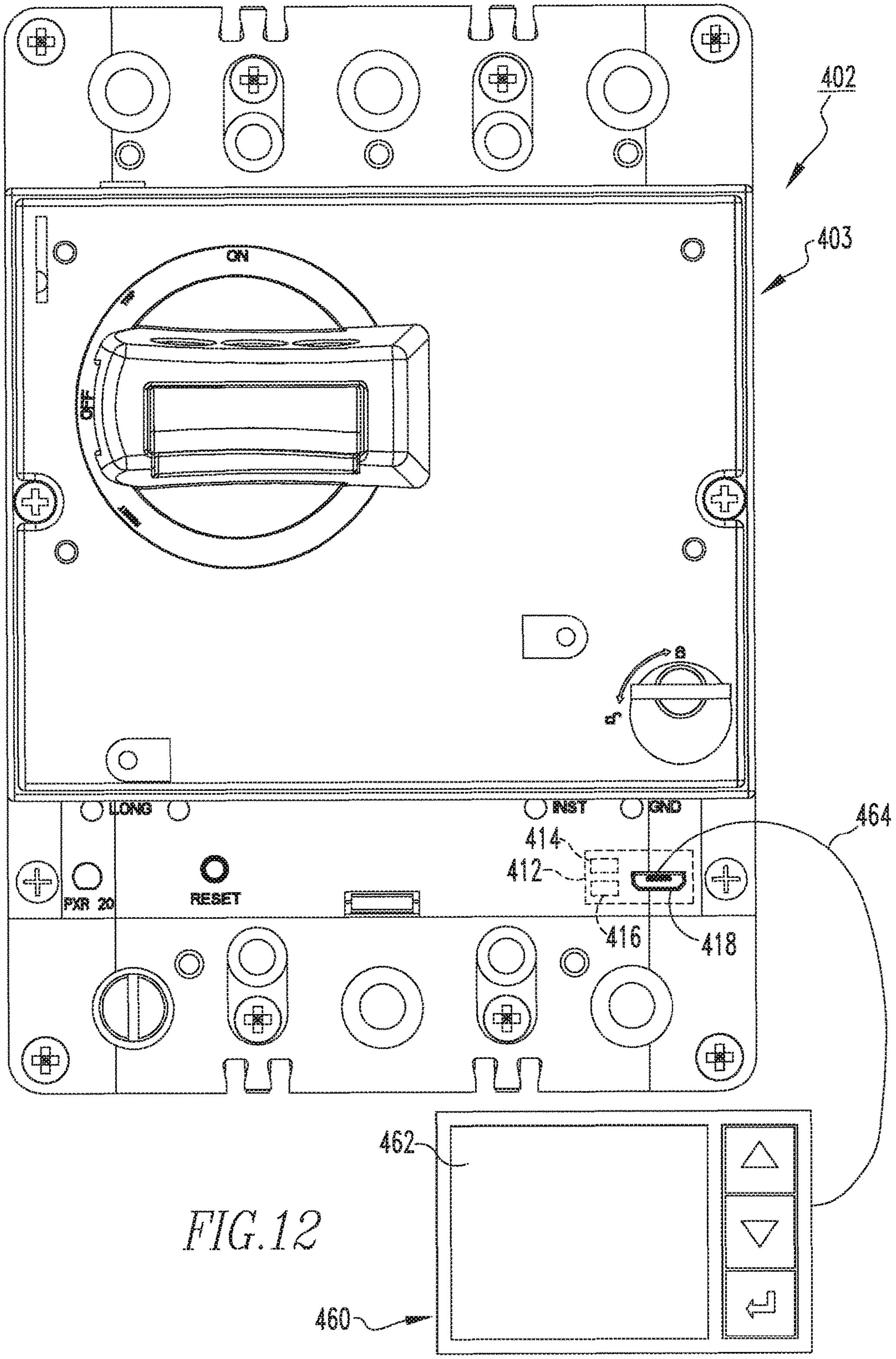
FIG. 12 is a top plan view of an electrical switching apparatus including a display apparatus, in accordance with another non-limiting embodiment of the disclosed concept.

FIG. 12 shows another electrical switching apparatus (e.g., molded case circuit breaker 402) in accordance with another non-limiting embodiment of the disclosed concept. The example circuit breaker 402 is substantially similar to the circuit breaker 302 (FIG. 10 and FIG. 11). Specifically, the circuit breaker 402 includes a body 403 and a display apparatus 460 located on the body. The body 403 includes a main printed circuit board 412 and a number of electrical rating settings (e.g., current rating setting 414 and ground fault setting 416, each shown in simplified form) associated with the main printed circuit board 412. The main printed circuit board 412 includes a universal serial bus port 418. The display apparatus 460 includes a display screen 462 and a cable 464 (shown in simplified form). The cable 464 is electrically connected to the display screen 462 and extends into the universal serial bus port 418 in order to connect the display screen 462 with the main printed circuit board 412. In this manner, the magnitudes of the current rating setting 414 and the ground fault setting 416 are displayed on the display screen 462 and are able to be adjusted by an operator.

Additionally, as shown, the display screen 462 is not connected with (i.e., is spaced from) the body 403 of the circuit breaker 402. Thus, it will be appreciated that the display screen 462 may be mounted or otherwise disposed in any known or suitable desired location or on any known or suitable structure (e.g., the wall of a building, not shown). Accordingly, among other benefits, the magnitudes of the current rating setting 414 and the ground fault setting 416 may be viewed and/or adjusted at locations (e.g., the wall of a building, not shown) that are separate and spaced apart from the body 403 of the circuit breaker 402.

Accordingly, it will be appreciated that the disclosed concept provides for an improved (e.g., without limitation, able to more easily view and/or adjust magnitudes of electrical rating settings 14,16,114,116,314,316,414,416) electrical switching apparatus 2,102 and interface assembly 30,130 therefor, and electrical switching apparatus 302,402 including display apparatus 360,460, which among other benefits, reduces service times by eliminating the need to disassemble components of the electrical switching apparatus 2,102,302,402 to view and/or adjust magnitudes of electrical rating settings 14,16,114,116,314,316,414,416.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical switching apparatus comprising:

a body comprising:

a housing, a handle partially extending through said housing, separable contacts disposed within said housing, an operating mechanism structured to open and close said separable contacts, a main printed circuit board disposed within said housing, and a number of electrical rating settings associated with said main printed circuit board, each of said number of electrical rating settings having a magnitude; and a display apparatus electrically connected to said main printed circuit board;

wherein said display apparatus is structured to display the magnitude of at least one of said number of electrical rating settings; wherein said body further comprises a base and a rotary handle; wherein said base is disposed on said housing; wherein said base has a mounting surface; wherein said rotary handle is coupled to said mounting surface; wherein said rotary handle and said handle are structured to drive each other; and wherein said display apparatus comprises a display screen disposed on said mounting surface proximate said rotary handle.

2. The electrical switching apparatus of claim 1 wherein said number of electrical rating settings comprises a current rating setting; and wherein said display apparatus is structured to adjust the magnitude of said current rating setting.

3. The electrical switching apparatus of claim 2 wherein said display screen is structured to display the magnitude of the current rating setting.

4. The electrical switching apparatus of claim 1 wherein said number of electrical rating settings comprises a ground fault setting; and wherein said display apparatus is structured to adjust the magnitude of said ground fault setting.

5. The electrical switching apparatus of claim 4 wherein said display screen is structured to display the magnitude of the ground fault setting.

6. The electrical switching apparatus of claim 1 wherein said main printed circuit board comprises a universal serial bus port; wherein said display apparatus further comprises a cable electrically connected with said display screen; and wherein said cable extends into said universal serial bus port in order to connect said display screen with said main printed circuit board.

7. The electrical switching apparatus of claim 1 wherein said display screen is connected to said mounting surface.

* * * * *